US010903426B2

(12) United States Patent
Fujito et al.

(10) Patent No.: US 10,903,426 B2
(45) Date of Patent: Jan. 26, 2021

(54) METAL MASK BASE, METAL MASK AND METHOD FOR PRODUCING METAL MASK

(71) Applicant: TOPPAN PRINTING CO., LTD., Tokyo (JP)

(72) Inventors: Daisei Fujito, Tokyo (JP); Kiyoaki Nishitsuji, Tokyo (JP); Takehiro Nishi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/869,597

(22) Filed: Jan. 12, 2018

(65) Prior Publication Data

US 2018/0138410 A1 May 17, 2018

Related U.S. Application Data

(63) Continuation of application No. PCT/JP2016/059041, filed on Mar. 22, 2016.

(30) Foreign Application Priority Data

Jul. 17, 2015 (JP) ................................. 2015-143509

(51) Int. Cl.
*H01L 51/00* (2006.01)
*B05C 21/00* (2006.01)
*C23F 1/16* (2006.01)
*H01L 51/56* (2006.01)
*H05B 33/10* (2006.01)
*C23F 1/02* (2006.01)
*C23C 14/04* (2006.01)

(52) U.S. Cl.
CPC ........ *H01L 51/0011* (2013.01); *B05C 21/005* (2013.01); *C23C 14/042* (2013.01); *C23F 1/02* (2013.01); *C23F 1/16* (2013.01); *H05B 33/10* (2013.01); *H01L 51/56* (2013.01)

(58) Field of Classification Search
None
See application file for complete search history.

(56) References Cited

U.S. PATENT DOCUMENTS 3,160,752 A  12/1964 Bennett
6,620,554 B1  9/2003 Komatsu et al.
(Continued)

FOREIGN PATENT DOCUMENTS

CN  1534383 A  10/2004
CN  1793433 A  6/2006
(Continued)

OTHER PUBLICATIONS

Notification of Reasons for Refusal dated May 7, 2018, in Japanese Patent Application No. 2017-529473, 5 pages.
Office Action dated Mar. 2, 2018, in Chinese Patent Application No. 201680012997.X, 11 pages.
Non-Final Office Action dated Aug. 10, 2018 in U.S. Appl. No. 15/786,463, 8 pages.
Japanese Standards Association, *Definitions and Designation of Surface Roughness*, JIS B 0601: 1982, 20 pages.
(Continued)

*Primary Examiner* — Jethro M. Pence
(74) *Attorney, Agent, or Firm* — Squire Patton Boggs (US) LLP

(57) ABSTRACT

A metal mask substrate includes a metal obverse surface configured such that a resist is placed on the obverse surface. The obverse surface has a three-dimensional surface roughness Sa of less than or equal to 0.11 μm. The obverse surface also has a three-dimensional surface roughness Sz of less than or equal to 3.17 μm.

4 Claims, 7 Drawing Sheets

(56) References Cited

U.S. PATENT DOCUMENTS

| | | | |
|---|---|---|---|
| 2003/0221613 | A1 | 5/2003 | Kang et al. |
| 2004/0018372 | A1 | 1/2004 | Komatsu et al. |
| 2004/0175633 | A1 | 9/2004 | Shoki et al. |
| 2004/0202821 | A1 | 10/2004 | Kim et al. |
| 2004/0224526 | A1 | 11/2004 | Shoki |
| 2006/0103289 | A1 | 5/2006 | Kim et al. |
| 2007/0072337 | A1 | 3/2007 | Matzuzaki et al. |
| 2008/0277157 | A1 | 11/2008 | Naito et al. |
| 2012/0019618 | A1* | 1/2012 | Lim ............ H04N 19/597 348/43 |
| 2013/0263749 | A1 | 10/2013 | Kernig et al. |
| 2014/0377903 | A1 | 12/2014 | Takeda et al. |
| 2016/0049586 | A1 | 2/2016 | Takeda et al. |
| 2016/0208392 | A1 | 7/2016 | Ikenaga et al. |
| 2016/0268511 | A1 | 9/2016 | Takeda et al. |
| 2016/0293844 | A1 | 10/2016 | Takeda et al. |
| 2017/0141315 | A1 | 5/2017 | Ikenaga |
| 2017/0186955 | A1 | 6/2017 | Takeda et al. |
| 2018/0038002 | A1 | 2/2018 | Tamura et al. |
| 2018/0065162 | A1 | 3/2018 | Mikami et al. |

FOREIGN PATENT DOCUMENTS

| | | |
|---|---|---|
| CN | 102851638 A | 1/2013 |
| CN | 103205680 A | 7/2013 |
| DE | 198 52 299 A1 | 5/1999 |
| JP | H04-314535 A | 11/1992 |
| JP | H05-290724 A | 11/1993 |
| JP | H 09-199812 A | 7/1997 |
| JP | H09-209176 A | 8/1997 |
| JP | H11-140667 A | 5/1999 |
| JP | H11-260255 A | 9/1999 |
| JP | 2002-151841 A | 5/2002 |
| JP | 2002-219505 A | 8/2002 |
| JP | 2002-246712 A | 8/2002 |
| JP | 2004-276435 A | 10/2004 |
| JP | 2005-076068 A | 3/2005 |
| JP | 2006-233285 A | 9/2006 |
| JP | 2007-095324 A | 4/2007 |
| JP | 2008-041553 A | 2/2008 |
| JP | 2009-052072 A | 3/2009 |
| JP | 2009-127105 A | 6/2009 |
| JP | 2010-214447 A | 9/2010 |
| JP | 2011-166018 A | 8/2011 |
| JP | 2012-087338 A | 5/2012 |
| JP | 2012-243454 A | 12/2012 |
| JP | 2013-209710 A | 10/2013 |
| JP | 2013-542327 A | 11/2013 |
| JP | 2013-245392 A | 12/2013 |
| JP | 2014-101543 A | 6/2014 |
| JP | 2014-133375 A | 7/2014 |
| JP | 2014-148758 A | 8/2014 |
| JP | 2014-208910 A | 11/2014 |
| JP | 5641462 B1 | 12/2014 |
| JP | 2015-055007 A | 3/2015 |
| JP | 2015-117432 A | 6/2015 |
| JP | 2015-127441 A | 7/2015 |
| JP | 2015-129333 A | 7/2015 |
| JP | 2015-129334 A | 7/2015 |
| KR | 2003-0092790 A | 12/2003 |
| WO | WO 2013/105643 A1 | 7/2013 |
| WO | WO 2014/038510 A1 | 3/2014 |

OTHER PUBLICATIONS

Japanese Standards Association, *Geometrical Product Specifications (GPS)—Surface texture: Profile method—Terms, definitions and surface texture parameters*, JIS B 0601: 2001, 31 pages.

International Organization for Standardization, *Geometrical product specifications (GPS)—Surface texture: Areal*, ISO 25178-2:2012(E), pp. iv and 9.

Notice of Reasons for Rejection dated Jan. 16, 2018, in Japanese Patent Application No. 2017-529473, 11 pages.

International Preliminary Report on Patentability dated Jan. 23, 2018, in International Patent Application No. PCT/JP2016/059041, 11 pages.

Third Party Observations filed with the German Patent and Trademark Office on Apr. 24, 2019, against German Patent Application No. DE 11 2016 003 225.0, 40 pages.

Bennett et al., "Relation Between Surface Roughness and Specular Reflectance at Normal Incidence," J Opt Soc Am. Feb. 1961; 51(2):123-129.

Non-Final Office Action dated Aug. 20, 2019, in U.S. Appl. No. 15/786,455, 19 pages.

Second Office Action dated Sep. 23, 2019, in Chinese Patent Application No. 201610561108.7, 17 pages.

Hishikawa et al., "Rolling Technology for Aluminum Sheet and Plate", Furukawa—Sky Review No. 4. Year:2008, English abstract included, 10 pages.

Tsukada and Kanada, "Evaluation of Two- and Three-Dimensional Surface Roughness Profiles and Their Confidence", Wear. 1986; 109: 69-78.

International Preliminary Report on Patentability dated Jan. 23, 2018, in International Application No. PCT/JP2016/069350, with translation, 10 pages.

International Preliminary Report on Patentability dated Jan. 23, 2018, in International Application No. PCT/JP2016/070951, with translation, 14 pages.

The Third Office Action for Chinese Patent Application No. 201610561108.7, dated Jun. 3, 2020, with English Translation, 42 pages.

Xu Qiangling, "Plating (Coating) Layer Quality Inspection Technology", with concise Explanation of Relevance, pp. 29-32, Jul. 1992.

Hui Wenhua et al. "Tribology and Wear Resistance Design", with concise Explanation of Relevance, pp. 488-489, Nov. 1993.

First Office Action for Chinese Patent Application No. 201811311762.8, dated Apr. 27, 2020, with English Translation, 26 pages.

Japanese Office Action, Notice of Reasons for Refusal, Japanese Patent Application No. 2019-127917, dated Aug. 25, 2020, with English Translation, 10 pages.

Third Chinese Office Action, for Chinese Patent Application CN 201680041439.6, dated Oct. 19, 2020, with English Translation, 40 pages.

Mo Yunqi, "Research on Maunfacturing Process of COF Flexible Printed Baord for LCD and PCB Failure Analysis", University of Electronic Science and Technology of China, Chengdu China, English Abstract translation, 5 pages, Oct. 19, 2009.

Yoshida et al. "Evaluation Parameters of Surface Texture on Shot-Blasted Surfaces", Journal of The Japan Institute of Light Metals, English abstract with translation, 5 pages, vol. 61, No. 5 (May 31, 2011):187-191.

* cited by examiner

METAL MASK BASE, METAL MASK AND METHOD FOR PRODUCING METAL MASK

BACKGROUND

The present disclosure relates to a metal mask substrate having a metal obverse surface for placing a resist, such as a metal mask substrate for forming a metal mask for organic electroluminescent devices, a metal mask, and a method for manufacturing a metal mask.

Metal mask substrates, which may be metal sheets, are used to manufacture metal masks for organic electroluminescent devices. A metal mask substrate includes an application surface to which a coating liquid including a material for forming a resist layer is applied to form a resist layer. The resist layer then undergoes exposure and development and is thus shaped into a predetermined pattern. The metal mask substrate is etched through the resist layer to manufacture a metal mask.

When forming the resist layer, the amount of coating liquid applied to the application surface and the degree of curing of the coating liquid may vary. This may result in resist layers of different thicknesses or a resist layer having an uneven thickness. To reduce such variations in resist layers, dry film resists have been proposed as resist layers (see Japanese Laid-Open Patent Publication No. 2013-209710, for example).

A resist layer that is formed using a coating liquid is formed by curing the coating liquid applied directly to the metal mask substrate. Such a layer easily assumes the shape corresponding to the application surface, facilitating the adhesion to the metal mask substrate. In contrast, a resist layer made of a dry film resist is formed by affixing a layer, which is formed separately from a metal mask substrate, onto one surface of the metal mask substrate. As compared with a resist layer formed from a coating liquid, the shape of such a resist layer less easily conforms to the application surface. This may result in the resist layer partially peeled off from the metal mask substrate.

Such a problem is not limited to a metal mask substrate made of a metal sheet, but is common to a metal mask substrate whose surface that is in contact with the resist layer is made of a metal or a metal alloy, such as a laminate of a plastic layer and a metal layer and a laminate in which metal layers sandwich a plastic layer. The problem is also common even to a resist layer formed from a coating liquid, which includes materials for forming a resist layer, when the resist layer has low adhesion to the metal mask substrate.

SUMMARY

It is an objective of the present disclosure to provide a metal mask substrate having an obverse surface that increases the adhesion at the interface between the obverse surface and a resist, a metal mask, and a method for manufacturing a metal mask.

To achieve the foregoing objective, a metal mask substrate is provided that includes a metal obverse surface configured such that a resist is placed on the obverse surface. The obverse surface has a three-dimensional surface roughness Sa of less than or equal to 0.11 µm. The obverse surface has a three-dimensional surface roughness Sz of less than or equal to 3.17 µm.

In this structure, the three-dimensional surface roughness Sa is less than or equal to 0.11 µm, and the three-dimensional surface roughness Sz is less than or equal to 3.17 µm. This increases the adhesion between the metal obverse surface and the resist.

In the above-described metal mask substrate, the obverse surface is a first surface, and the resist is a first resist. The metal mask substrate further comprises a metal second surface, which is a surface opposite to the first surface and configured such that a second resist is placed on the second surface. The second surface has a three-dimensional surface roughness Sa of less than or equal to 0.11 µm, and the second surface has a three-dimensional surface roughness Sz of less than or equal to 3.17 µm.

Such a structure increases the adhesion between the first surface and the first resist and the adhesion between the second surface and the second resist. This improves the accuracy in the etching of the first surface and the second surface.

In the above-described the metal mask substrate, the obverse surface is made of Invar.

The linear expansion coefficient of Invar is equivalent to that of a glass base. Thus, the structure described above allows the metal mask that is formed of the metal mask substrate, that is, the metal mask manufactured with high shape accuracy, to be used for the deposition on a glass base.

The above-described metal mask substrate further includes a metal layer, which is made of Invar. The obverse surface is an obverse surface of the metal layer, and the metal mask substrate further comprises a polyimide layer, which faces a surface of the metal layer that is opposite to the obverse surface.

The linear expansion coefficient of polyimide is equivalent to that of Invar. Thus, the metal mask substrate described above allows the metal mask to resist warpage, which would otherwise occur when the temperature of the metal mask changes, even though the metal mask includes two different materials. This allows the metal mask to have high shape accuracy and enhanced mechanical strength.

In the above-described metal mask substrate, the resist is a dry film resist, and the obverse surface is configured such that the dry film resist is affixed to the obverse surface.

This structure increases the adhesion between the dry film resist and the metal obverse surface that is configured such that a dry film resist is affixed to the obverse surface.

To achieve the foregoing objective, a metal mask is provided that includes a metal mask substrate including a metal obverse surface. The metal mask substrate includes a plurality of through-holes, which extend through the metal mask substrate in a thickness direction of the metal mask substrate and have openings in the obverse surface, and $(B/A) \times 100(\%)$ is less than or equal to 10%, where A represents an average of dimensions of the openings in a plan view of the obverse surface, and B represents a value obtained by multiplying a standard deviation of the dimensions by 3.

To achieve the foregoing objection, a method for manufacturing a metal mask is provided that includes: preparing a metal mask substrate that includes a metal obverse surface, which is configured such that a resist is placed on the obverse surface, wherein the obverse surface has a three-dimensional surface roughness Sa of less than or equal to 0.11 µm and a three-dimensional surface roughness Sz of less than or equal to 3.17 µm; placing a resist on the obverse surface; forming through-holes in the resist for forming a plurality of depressions in the metal mask substrate, wherein the depressions extend in a thickness direction of the metal mask substrate and have openings in the obverse surface; and forming the depressions in the metal mask substrate through the resist. The forming the depressions in the metal mask substrate includes forming the depressions in the metal mask substrate such that (B/A)×100(%) is less than or equal to 10%, where A represents an average of dimensions of the openings in a plan view of the obverse surface, and B represents a value obtained by multiplying a standard deviation of the dimensions by 3.

DESCRIPTION OF EXEMPLARY EMBODIMENTS

Referring to FIGS. 1 to 20, a metal mask substrate for dry film resist as one embodiment of a metal mask substrate, a metal mask, and one embodiment of a method for manufacturing a metal mask are now described. The metal mask manufactured using the metal mask substrate for dry film resist of the present embodiment is used to deposit an organic material for forming organic electroluminescent devices onto a glass base by vaporization in a process of manufacturing organic electroluminescent devices. In the following descriptions, the structure of the metal mask substrate for dry film resist, the structure of the metal mask, a method for manufacturing a metal mask substrate for dry film resist, a method for manufacturing a metal mask, and Examples are described in this order.

[Structure of Metal Mask Substrate for Dry Film Resist]

Referring to FIGS. 1 to 4, the structure of a metal mask substrate for dry film resist is now described.

Figure 1:
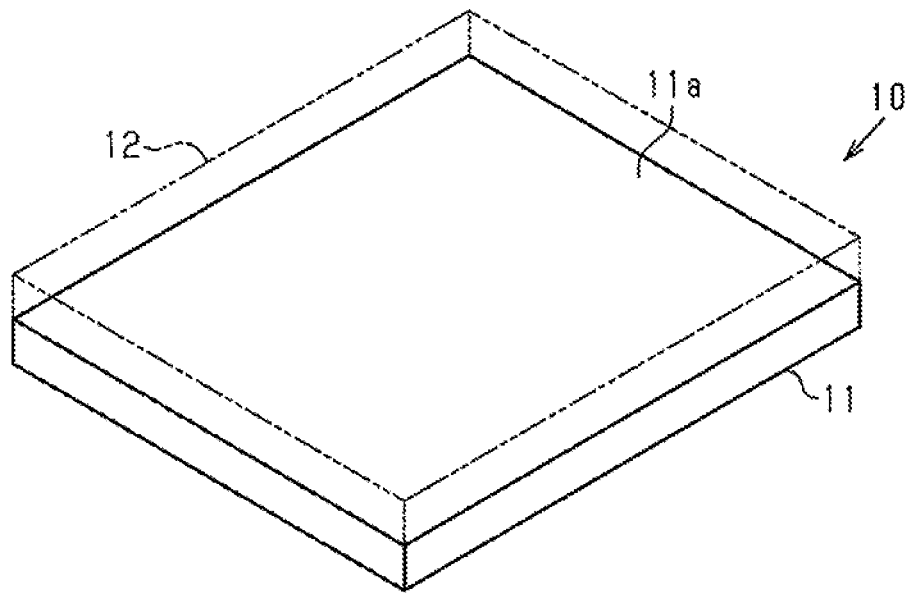
FIG. 1 is a partial perspective view showing a part of the structure of a metal mask substrate for dry film resist as one embodiment of a metal mask substrate according to the present disclosure.

As shown in FIG. 1, a metal mask substrate 11, which is an example of a metal mask substrate for dry film resist, is a metal layer extending along one plane. The metal mask substrate 11 includes a metal first surface 11a, which is an example of an obverse surface that is configured such that a resist is placed on the obverse surface, more specifically, an obverse surface that is configured such that a dry film resist is affixed to the obverse surface. The first surface 11a has a three-dimensional surface roughness Sa of less than or equal to 0.11 μm and a three-dimensional surface roughness Sz of less than or equal to 3.17 μm.

The three-dimensional surface roughness Sa and the three-dimensional surface roughness Sz are values obtained by a method in accordance with ISO 25178. The three-dimensional surface roughness Sa is the arithmetical mean height Sa in a defined region having a specified area, and the three-dimensional surface roughness Sz is the maximum height Sz in a defined region having a specified area.

The metal mask substrate 11 has a three-dimensional surface roughness Sa of less than or equal to 0.11 μm and a three-dimensional surface roughness Sz of less than or equal to 3.17 μm. This limits the formation of gaps between the first surface 11a and a first dry film resist 12, which is affixed to the first surface 11a, increasing the adhesion at the interface between the first dry film resist 12 and the first surface 11a of the metal mask substrate 11. The laminate of the metal mask substrate 11 and the first dry film resist 12, which is affixed to the first surface 11a, is a metal mask formation intermediate 10, which is an intermediate for forming a metal mask.

The metal layer is preferably made of Invar, which is an alloy that is mainly composed of iron and nickel and contains 36 mass % of nickel. The linear expansion coefficient of Invar is about $1.2 \times 10^{-6}/°$ C. The metal layer preferably has a thickness of between 10 μm and 50 μm inclusive, for example.

The linear expansion coefficient of Invar is equivalent to that of a glass base. Thus, when the metal layer is made of Invar, the metal mask formed of the metal mask substrate, that is, the metal mask manufactured with high shape accuracy, is used for the deposition on a glass base.

The first dry film resist 12 may be made of a negative resist, which is an example of a photosensitive material. The first dry film resist 12 may be made of an acrylic plastic that is cross-linked by photopolymerization. The first dry film resist 12 preferably has a thickness of between 5 μm and 20 μm inclusive, for example. The first dry film resist 12 is typically a negative resist, but may also be made of a positive resist.

Figure 2:
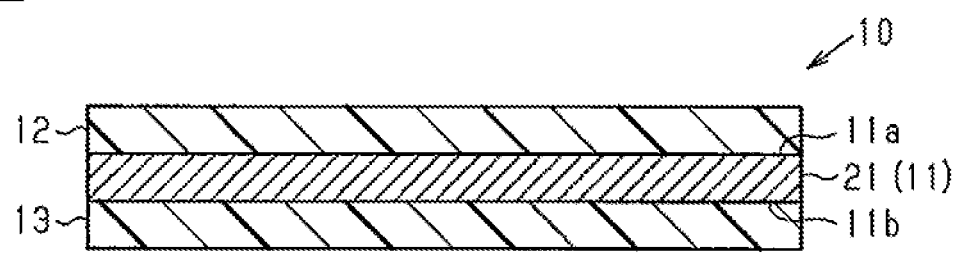
FIG. 2 is a partial cross-sectional view showing a part of the cross-sectional structure of an example of a metal mask substrate for dry film resist.
Figure 3:
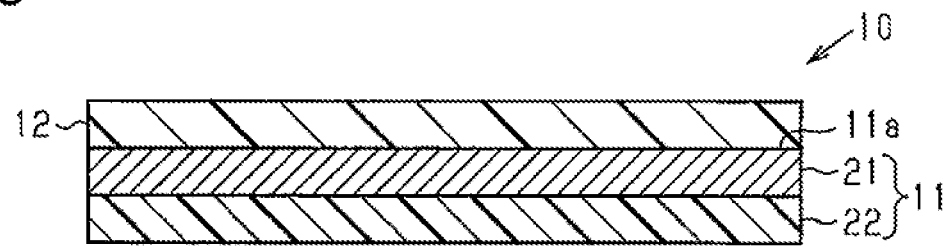
FIG. 3 is a partial cross-sectional view showing a part of the cross-sectional structure of an example of a metal mask substrate for dry film resist.
Figure 4:
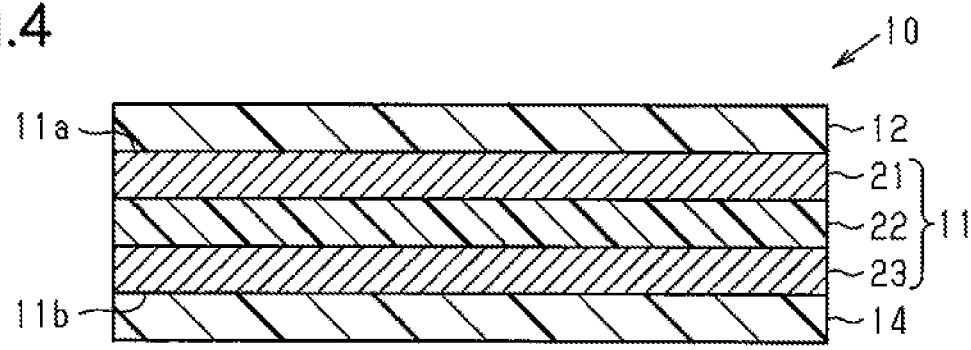
FIG. 4 is a partial cross-sectional view showing a part of the cross-sectional structure of an example of a metal mask substrate for dry film resist.

Referring to FIGS. 2 to 4, other embodiments of a metal mask substrate 11 and a metal mask formation intermediate 10 are described below. FIG. 2 shows a first embodiment, which is an example of a metal mask substrate 11 consisting of one metal layer, and FIG. 3 shows a second embodiment, which is an example of a metal mask substrate 11 consisting one metal layer and one plastic layer. FIG. 4 shows a third embodiment, which is an example of a metal mask substrate 11 consisting of two metal layers and one plastic layer.

First Embodiment

As shown in FIG. 2, a metal layer 21 includes a second surface 11b, which is a surface opposite to the first surface 11a. The first surface 11a is a metal obverse surface that is configured such that a first dry film resist 12 is affixed to the obverse surface, and the second surface 11b is an example of an obverse surface that is configured such that a resist is placed on the obverse surface, specifically, a metal obverse surface that is configured such that a second dry film resist 13 is affixed to the obverse surface. The metal layer 21, the first dry film resist 12, and the second dry film resist 13 form a metal mask formation intermediate 10.

As with the first surface 11a, the second surface 11b preferably has a three-dimensional surface roughness Sa of less than or equal to 0.11 μm and a three-dimensional surface roughness Sz of less than or equal to 3.17 μm. The metal mask substrate 11 thus has an increased adhesion between the second dry film resist 13 and the metal layer 21 at the second surface 11b of the metal layer 21 in addition to the first surface 11a.

The second dry film resist 13 may be made of an acrylic plastic that is cross-linked by photopolymerization, as is the case with the first dry film resist 12. The second dry film resist 13 preferably has a thickness of between 5 μm and 20 μm inclusive, for example.

Second Embodiment

As shown in FIG. 3, a metal mask substrate 11 may include a metal layer 21 and a plastic layer 22, which is located on the side of the metal layer 21 opposite to a first dry film resist 12. The linear expansion coefficient of the plastic layer 22 preferably has similar temperature dependency as the linear expansion coefficient of the metal layer 21. In addition, the value of the linear expansion coefficient of the plastic layer 22 is preferably equivalent to that of the metal layer 21. The metal layer 21 may be an Invar layer made of Invar, while the plastic layer 22 may be a polyimide layer made of polyimide. The metal mask substrate 11 resists warpage, which would otherwise occur due to any difference between the linear expansion coefficient of the metal layer 21 and the linear expansion coefficient of the plastic layer 22.

The metal mask formation intermediate 10 of this embodiment consists of the metal layer 21, the first dry film resist 12, and the plastic layer 22. The plastic layer 22 may be formed by applying a liquid to the metal layer 21, or may be formed separately from the metal layer 21 as a film and affixed to the metal layer 21. If the plastic layer 22 is affixed to the metal layer 21, the plastic layer 22 may include an adhesion layer that is adhesive to the metal layer 21, and the adhesion layer may be affixed to the metal layer 21.

Third Embodiment

As shown in FIG. 4, a metal mask substrate 11 may include a metal layer 21, a plastic layer 22, and an additional metal layer 23, which is located on the side of the plastic layer 22 opposite to the metal layer 21 in the thickness direction of the metal mask substrate 11. In this metal mask substrate 11, the surface of the metal mask substrate 11 opposite to the first surface 11a is a second surface 11b, which is one of the surfaces of the metal layer 23.

As with the metal layer 21, the additional metal layer 23 is preferably made of Invar, which is an alloy that is mainly composed of iron and nickel and contains 36 mass % of nickel. The metal layer 23 preferably has a thickness of between 10 μm and 50 μm inclusive, for example. The thickness of the additional metal layer 23 may be the same as or different from the thickness of the metal layer 21.

As with the first surface 11a and the second surface 11b of the metal layer 21, the second surface 11b of the additional layer 23 preferably has a three-dimensional surface roughness Sa of less than or equal to 0.11 μm and a three-dimensional surface roughness Sz of less than or equal to 3.17 μm.

The second surface 11b of the additional metal layer 23 thus has the same advantage as the first surface 11a and the second surface 11b of the metal layer 21. Since the metal mask substrate 11 is a structure in which the metal layer 21 and the plastic layer 22 are layered and the metal layer 23 and the plastic layer 22 are layered, the metal mask substrate 11 has the same advantage as the metal mask substrate 11 described above with reference to FIG. 3.

The metal mask formation intermediate 10 of this embodiment consists of the metal layers 21 and 23, the first dry film resist 12, the plastic layer 22, and the second dry film resist 14. The plastic layer 22 may be formed by applying a liquid to one of the two metal layers, or may be formed separately from the metal layers 21 and 23 as a film and affixed to the metal layers 21 and 23. If the plastic layer 22 is affixed to the metal layers 21 and 23, the plastic layer 22 may include an adhesion layer that is adhesive to the metal layer 21 and an adhesion layer that is adhesive to the metal layer 23, and these adhesion layers may be affixed to the two metal layers 21 and 23.

[Structure of Metal Mask]

Figure 5:
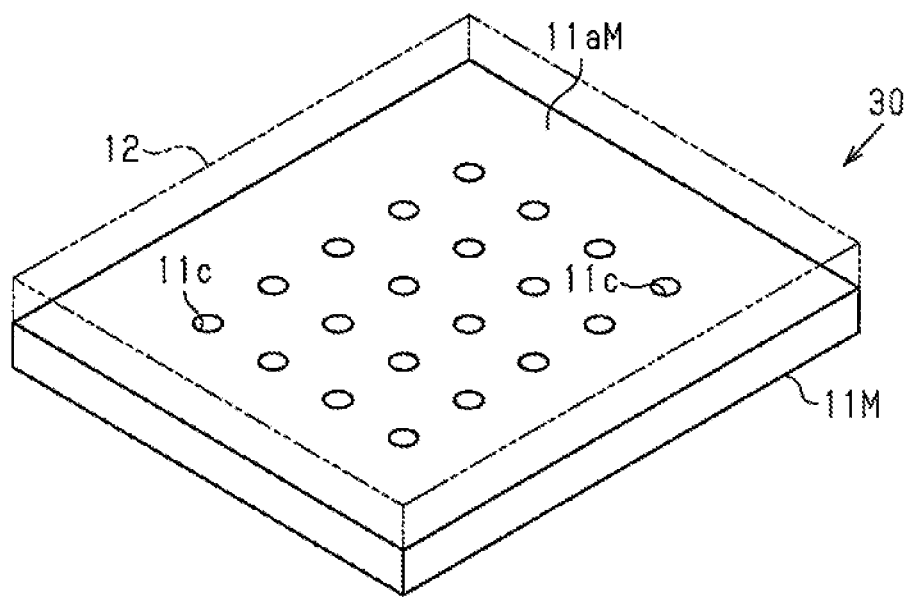
FIG. 5 is a partial perspective view showing a part of the structure of a metal mask manufactured using a metal mask substrate for dry film resist.
Figure 6:
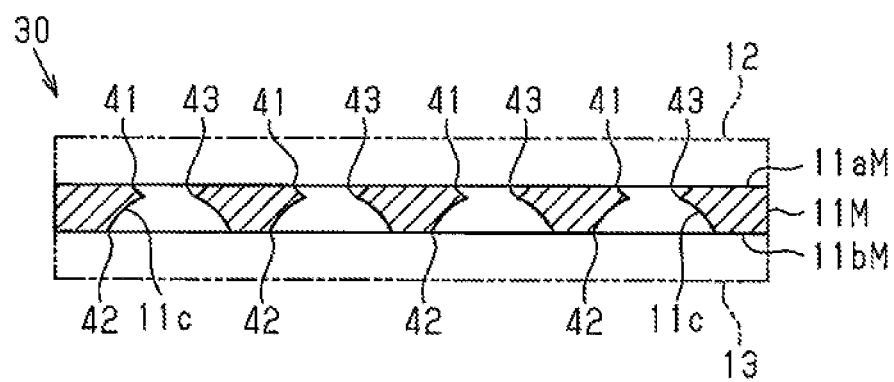
FIG. 6 is a partial cross-sectional view showing a part of the cross-sectional structure of the metal mask.

Referring to FIGS. 5 and 6, the structure of a metal mask is now described. In the following descriptions, the metal mask substrate 11 used to manufacture a metal mask consists of one metal layer 21, that is, the first embodiment described referring to FIG. 2 is used.

As shown in FIG. 5, a metal mask 30 includes a mask base 11M, which is a metal mask substrate 11 that has been processed. The mask base 11M is an example of a metal mask substrate. The mask base 11M includes a first mask surface 11aM, which is a metal obverse surface corresponding to the first surface 11a of the metal mask substrate 11 and from which the first dry film resist 12 has been removed.

The first surface 11a of the metal mask substrate 11 may undergo various processing steps, such as cleaning, before the first dry film resist 12 is affixed to the first surface 11a, provided that the processing steps allow the first mask surface 11aM to maintain substantially the same values of three-dimensional surface roughness Sa and three-dimensional surface roughness Sz as the first surface 11a, which is the surface before processing.

The mask base 11M includes a plurality of through-holes 11c, which extend through the mask base 11M in the thickness direction and open to the first mask surface 11aM. In a plan view of the first mask surface 11aM, for example, the through-holes 11c are arranged regularly in a specific direction along the first mask surface 11aM and arranged regularly in a direction perpendicular to the specific direction.

As shown in FIG. 6, the mask base 11M includes a second mask surface 11bM, which is a metal surface corresponding to the second surface 11b of the metal mask substrate 11 and from which the second dry film resist 13 has been removed.

The second surface 11b of the metal mask substrate 11 may undergo various processing steps, such as cleaning, before the second dry film resist 13 is affixed to the second surface 11b, provided that the processing steps allow the second mask surface 11bM to maintain substantially the same values of three-dimensional surface roughness Sa and three-dimensional surface roughness Sz as the second surface 11b, which is the surface before processing.

The through-holes 11c extend through the first mask surface 11aM and the second mask surface 11bM. The cross-sectional area of each through-hole 11c in a plane perpendicular to the direction in which the through-hole 11c extends through the mask base 11M is smallest in a portion between the first mask surface 11aM and the second mask surface 11bM.

When the metal mask 30 is manufactured, the adhesion between the second dry film resist 13 and the metal layer 21 is increased also at the second surface 11b. This increases the shape accuracy of the through-holes 11c when the through-holes 11c are formed by etching the first surface 11a and the second surface 11b.

Each through-hole 11c includes a first opening 41, which opens to the first mask surface 11aM, a second opening 42, which opens to the second mask surface 11bM, and a constricted part 43, which is located between the first opening 41 and the second opening 42 in the thickness direction of the metal layer 21. In a plan view of the first mask surface 11aM, the first opening 41 is smaller than the second opening 42. Each through-hole 11c is shaped such that the cross-sectional area decreases from the first opening 41 toward the constricted part 43 and also decreases from the second opening 42 toward the constricted part 43. The distance between the first opening 41 and the constricted part 43, that is, the distance between the first mask surface 11aM and the constricted part 43, is preferably minimized.

In the metal mask 30, (B/A)×100(%) is preferably less than or equal to 10%, where A represents the average of the dimensions of the first openings 41 in a plan view of the first mask surface 11aM, and B represents the value obtained by multiplying the standard deviation of dimensions by 3. Further, in the metal mask 30, (B/A)×100(%) is preferably less than or equal to 10%, where A represents the average of the dimensions of the second openings 42 in a plan view of the second mask surface 11bM, and B represents the value obtained by multiplying the standard deviation of dimensions by 3.

Since the (B/A)×100(%) is less than or equal to 10% in the metal mask 30, the first openings 41 and the second openings 42 of the through-holes 11c of the metal mask 30 are formed with high dimensional accuracy.

In the cross-section along the thickness direction, the intervals between the through-holes 11c arranged in one direction may be reduced so that the depressions, including the second openings 42, of adjacent through-holes 11c are connected. In this structure, the thickness of the section in which two second openings 42 are connected is smaller than the thickness of the section of the metal mask 30 that is free of the through-holes 11c.

When the metal mask substrate 11 used to manufacture a metal mask is the second embodiment, the mask base 11M consists of a metal layer and a plastic layer. Such a mask base 11M includes the first mask surface 11aM described above, but the surface opposite to the first mask surface 11aM is a surface of the plastic layer and not a metal obverse surface. In this structure, the second openings 42 are preferably formed in the first mask surface 11aM, and the first openings 41 are preferably formed in the surface of the plastic layer.

When the metal mask substrate 11 used to manufacture a metal mask is the third embodiment, the mask base 11M consists of a plastic layer and two metal layers sandwiching the plastic layer. In such a mask base 11M, the first mask surface 11aM is a surface of one of the metal layers, and the second mask surface 11bM is a surface of the other metal layer. The through-holes 11c extend through the plastic layer and the two metal layers.

[Method for Manufacturing Metal Mask Substrate for Dry Film Resist]

Figure 7:
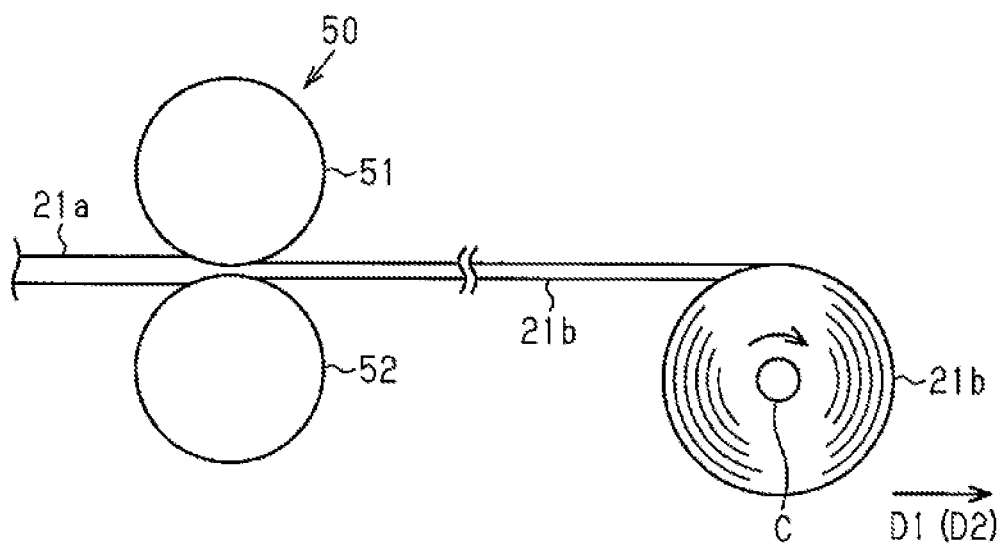
FIG. 7 is a process drawing for illustrating a method for manufacturing a metal mask substrate for dry film resist, in which a step of rolling a base material made of Invar is shown.
Figure 8:
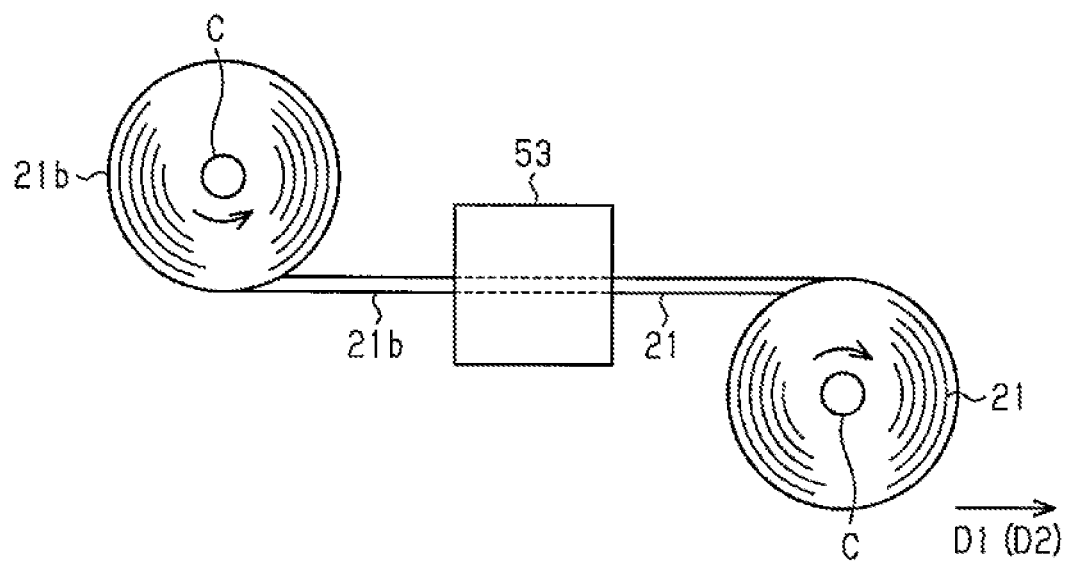
FIG. 8 is a process drawing for illustrating the method for manufacturing a metal mask substrate for dry film resist, in which a step of annealing the rolled material is shown.

Referring to FIGS. 7 and 8, a method for manufacturing a metal mask substrate for dry film resist is now described. In the following descriptions, a metal mask substrate 11 consisting of one metal layer 21, that is, the first embodiment described referring to FIG. 2, is used.

As shown in FIG. 7, in the method for manufacturing a metal mask substrate for dry film resist, a base material 21a made of Invar is prepared. The base material 21a extends in an extension direction D1, which is one direction. The base material 21a is transferred in a transfer direction D2 toward a rolling mill 50, which includes a pair of rolls 51 and 52, such that the extension direction D1 of the base material 21a is aligned with the transfer direction D2.

When the base material 21a reaches the pair of rolls 51 and 52, the rolls 51 and 52 press and extend the base material 21a. This reduces the thickness of the base material 21a and extends the base material 21a in the transfer direction D2, thereby forming a rolled material 21b. The rolled material 21b is wound around a core C. However, the rolled material 21b may be handled as extended in the shape of a strip, instead of wound around the core C. The rolled material 21b may have a thickness of between 10 μm and 50 μm inclusive.

As shown in FIG. 8, an annealing device 53 is used to anneal the rolled material 21b to remove the residual stress remaining in the rolled material 21b, which is formed by rolling the base material 21a. The metal layer 21, which serves as a metal mask substrate, is thus obtained. The rolled material 21b is annealed while the rolled material 21b is extended in the transfer direction D2. This allows the metal layer 21, which serves as a metal mask substrate, to have a reduced residual stress as compared with the rolled material 21b before annealing.

The rolling step and the annealing step may be modified as follows. For example, in the rolling step, the rolling mill may include a plurality of pairs of rolls. The rolling step and the annealing step may be repeated to manufacture the metal layer 21. Further, instead of annealing the rolled material 21b while extending the rolled material 21b in the transfer direction D2, the rolled material 21b may be annealed while wound around the core C.

Nevertheless, if the annealing is performed on the rolled material 21b wound around the core C, the winding of the metal layer 21 around the core C may cause the metal layer 21 after annealing to have the tendency for warpage according to the radius of the metal layer 21. Thus, depending on the radius of the metal layer 21 wound around the core C and the material of the base material 21a, it may be preferable that the rolled material 21b be annealed while extended in the transfer direction D2.

[Method for Manufacturing Metal Mask]

Referring to FIGS. 9 to 14, a method for manufacturing a metal mask 30 is now described. In the following descriptions, the metal mask substrate 11 used to manufacture a metal mask 30 consists of one metal layer 21, that is, the first embodiment described referring to FIG. 2 is used. FIGS. 9 to 14 are process drawings that show the section including only one of the through-holes 11c of the metal mask 30 for the illustrative purposes.

The method for manufacturing a metal mask includes: preparing a metal mask substrate including a metal obverse surface; placing a resist on the obverse surface; forming through-holes in the resist for forming a plurality of depressions, which extend in the thickness direction of the metal mask and include openings in the obverse surface; and forming the depressions in the metal mask substrate. When forming depressions in the metal mask substrate, the depressions are preferably formed in the metal mask substrate such that (B/A)×100(%) is less than or equal to 10%, where A represents the average of the dimensions of the openings in a plan view of the obverse surface, and B represents the value obtained by multiplying the standard deviation of dimensions by 3.

When each depression of the metal mask substrate is a hole defining a circular region in a plan view of the obverse surface of the metal mask substrate, the dimension of the opening of the depression may be the diameter of the opening. When each depression of the metal mask substrate is a hole defining a rectangular region extending in one direction in a plan view of the obverse surface of the metal mask substrate, the dimension of the opening of the depression may be the dimension in the longitudinal direction of the opening or the dimension in the transverse direction of the opening. When each depression of the metal mask substrate is a hole defining a square region in a plan view of the obverse surface of the metal mask substrate, the dimension of the opening of the depression may be the dimension of one side of the opening.

When each depression is a hole defining a rectangular region extending in one direction or a square region, the corners of the region defined by the depression may be curved with the center of curvature located inside the region defined by the depression.

Figure 9:
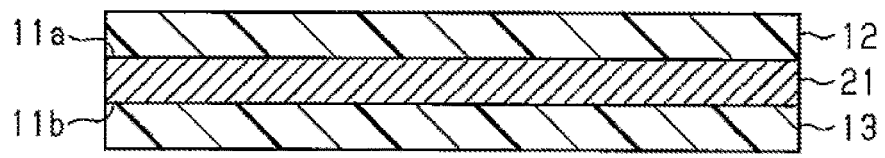
FIG. 9 is a process drawing for illustrating the method for manufacturing a metal mask, in which a step of affixing dry film resists is shown.

Specifically, as shown in FIG. 9, the manufacture of a metal mask 30 starts with the preparation of a metal mask substrate, which is the metal layer 21 including the first surface 11a and the second surface 11b as described above, a first dry film resist 12 to be affixed to the first surface 11a, and a second dry film resist 13 to be affixed to the second surface 11b. The two dry film resists 12 and 13 are films formed separately from the metal layer 21.

Then, the first dry film resist 12 is affixed to the first surface 11a, and the second dry film resist 13 is affixed to the second surface 11b. That is, the first dry film resist 12 is layered over the first surface 11a, and the second dry film resist 13 is layered over the second surface 11b. For example, with the metal layer 21 sandwiched between the two dry film resists in the thickness direction of the metal layer 21, the three layers are subjected to predetermined heat and pressure, so that the first dry film resist 12 is affixed to the first surface 11a of the metal layer 21 and the second dry film resist 13 is affixed to the second surface 11b. Alternatively, the first dry film resist 12 and the second dry film resist 13 may be separately affixed to the metal layer 21.

To increase the adhesion between the two dry film resists 12 and 13 and the metal layer 21, the first and second surfaces 11a and 11b of the metal layer 21 are preferably smooth. In this respect, since the first and second surfaces 11a and 11b both have a three-dimensional surface roughness Sa of less than or equal to 0.11 μm and a three-dimensional surface roughness Sz of less than or equal to 3.17 μm, the adhesion between the dry film resists 12 and 13 and the metal layer 21 is high enough to manufacture a metal mask in a satisfactory manner. The metal mask formation intermediate is thus manufactured.

Figure 10:
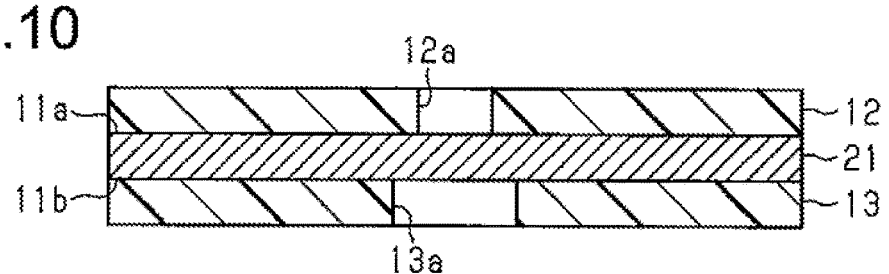
FIG. 10 is a process drawing for illustrating the method for manufacturing a metal mask, in which a step of developing the dry film resists is shown.

As shown in FIG. 10, the sections of the dry film resists 12 and 13 other then the sections in which through-holes are to be formed are exposed to light, and the exposed dry film resists are developed. This forms first through-holes 12a in the first dry film resist 12 and second through-holes 13a in the second dry film resist 13. That is, the first and second dry film resists 12 and 13 undergo patterning.

When exposing the first dry film resist 12 to light, an original plate is placed on the surface of the first dry film resist 12 that is opposite to the surface in contact with the metal layer 21. The original plate is configured to allow the light to reach the sections other than the sections in which first through-holes 12a are to be formed. When exposing the second dry film resist 13 to light, an original plate is placed on the surface of the second dry film resist 13 that is opposite to the surface in contact with the metal layer 21. The original plate is configured to allow the light to reach the sections other than the sections in which second through-holes 13a are to be formed. The development of the exposed dry film resists uses a sodium carbonate solution, for example, as the developing solution.

If the first dry film resist 12 is made of a positive resist, the sections of the first dry film resist 12 in which first through-holes 12a are to be formed are exposed to light. If the second dry film resist 13 is made of a positive resist, the sections of the second dry film resist 13 in which second through-holes 13a are to be formed are exposed to light.

Figure 11:
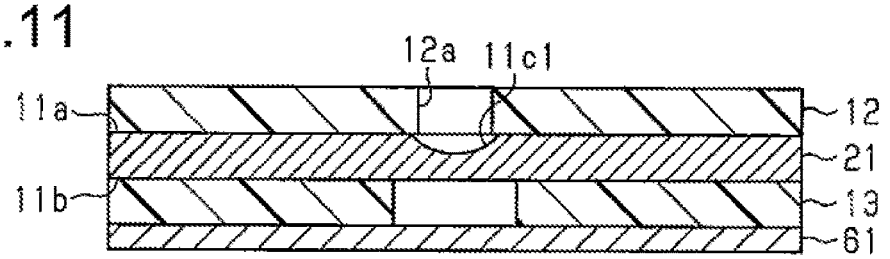
FIG. 11 is a process drawing for illustrating the method for manufacturing a metal mask, in which a step of etching the first surface of the metal layer is shown.

As shown in FIG. 11, the first surface 11a of the metal layer 21 is etched with ferric chloride solution using the first dry film resist 12 as the mask, that is, through the first dry film resist 12. Here, a second protection layer 61 is formed on the second dry film resist 13 so that the second surface 11b of the metal layer 21 is not etched together with the first surface 11a. The second protection layer 61 may be made of any material that resists etching with the ferric chloride solution. First depressions 11c1, which extend toward the second surface 11b of the metal layer 21, are thus formed in the first surface 11a through the first through-holes 12a in the first dry film resist 12.

The metal mask formation intermediate has an increased adhesion between the first dry film resist 12 and the metal layer 21. This limits entry of the ferric chloride solution into the interface between the first dry film resist 12 and the metal layer 21 when the metal layer 21 is exposed to the ferric chloride solution and while the first surface 11a of the metal layer 21 is in contact with the ferric chloride solution through the first through-holes 12a formed in the first dry film resist 12. Accordingly, the first depressions 11c1 are formed in the metal layer 21 with high shape accuracy.

The first depressions 11c1 are formed in the metal layer 21 such that (B/A)×100(%) is less than or equal to 10%, where A represents the average of the dimensions of the openings of the first depressions 11c1 in a plan view of the first surface 11a, and B represents the value obtained by multiplying the standard deviation of dimensions by 3.

Figure 12:
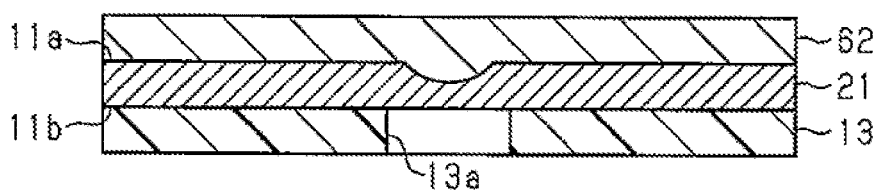
FIG. 12 is a process drawing for illustrating the method for manufacturing a metal mask, in which a step of forming a first protection layer is shown.

As shown in FIG. 12, the first dry film resist 12 on the first surface 11a of the metal layer 21 and the second protection layer 61 on the second dry film resist 13 are removed. A first protection layer 62 is formed on the first surface 11a of the metal layer 21 to prevent etching of the first surface 11a. The first protection layer 62 may be made of any material that resists etching with ferric chloride solution.

Figure 13:
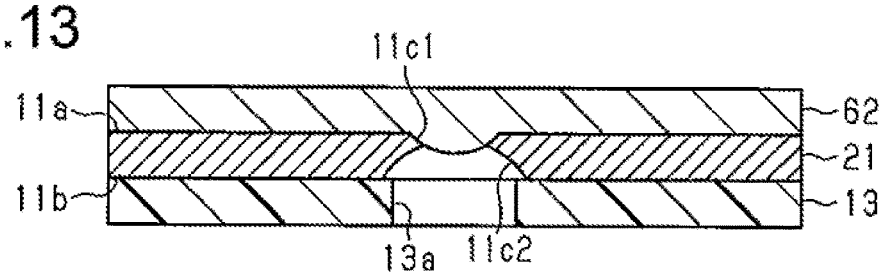
FIG. 13 is a process drawing for illustrating the method for manufacturing a metal mask, in which a step of etching a second surface of the metal layer is shown.

As shown in FIG. 13, the second surface 11b of the metal layer 21 is etched with ferric chloride solution using the second dry film resist 13 as the mask. Second depressions 11c2, which extend toward the first surface 11a of the metal layer 21, are thus formed in the second surface 11b through the second through-holes 13a in the second dry film resist 13.

The metal mask formation intermediate has an increased adhesion between the second dry film resist 13 and the metal layer 21. This limits entry of the ferric chloride solution into the interface between the second dry film resist 13 and the metal layer 21 when the metal layer 21 is exposed to the ferric chloride solution and while the second surface 11b of the metal layer 21 is in contact with the ferric chloride solution through the second through-holes 13a formed in the second dry film resist 13. Accordingly, the second depressions 11c2 are formed in the metal layer 21 with high shape accuracy.

The second depressions 11c2 are formed in the metal layer 21 such that (B/A)×100(%) is less than or equal to 10%, where A represents the average of the dimensions of the openings of the second depressions 11c2 in a plan view of the second surface 11b, and B represents the value obtained by multiplying the standard deviation of dimensions by 3.

Figure 14:
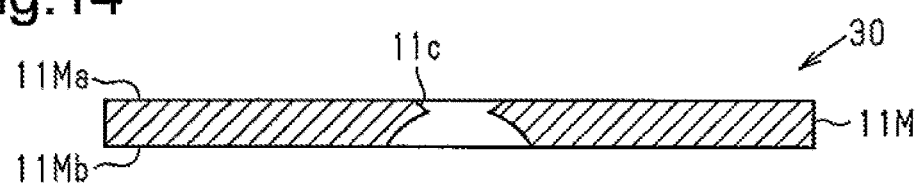
FIG. 14 is a process drawing for illustrating the method for manufacturing a metal mask, in which a step of removing the dry film resists is shown.

As shown in FIG. 14, the first protection layer 62 and the second dry film resist 13 are removed from the metal layer 21 to obtain the metal mask 30 including through-holes 11c.

When the metal mask substrate 11 used to manufacture a metal mask is the second embodiment, the metal mask formation intermediate consists of a metal layer, a plastic layer, and a first dry film resist 12. In addition to the etching using the first dry film resist 12 as the mask, the plastic layer of this metal mask formation intermediate may be perforated using laser.

When the metal mask substrate 11 used to manufacture a metal mask is the third embodiment, the metal mask formation intermediate consists of a plastic layer, two metal layers sandwiching the plastic layer, and two dry film resists 12 and 14. In addition to the etching using the dry film resists 12 and 14 as the masks, the plastic layer of this metal mask formation intermediate may be perforated using laser.

EXAMPLES

Referring to FIGS. 15 to 20, Examples are now described. In the following Examples, each metal mask substrate consists of one metal layer.

[Surface Roughness Measurement]

The three-dimensional surface roughness Sa and three-dimensional surface roughness Sz of each of the metal mask substrates of Examples 1 to 3 and the metal mask substrate of Comparison Example 1 were measured using the following method. The unit of all values of three-dimensional surface roughness Sa and three-dimensional surface roughness Sz is μm.

The metal mask substrates of Examples 1 to 3 and the metal mask substrate of Comparison Example 1 were obtained by preparing an original sheet for metal mask substrates having a width of 430 mm and by cutting out a 500-mm-long section from the original sheet. The metal mask substrate had a thickness of 20 μm and was made of Invar.

The three-dimensional surface roughness Sa and the three-dimensional surface roughness Sz were measured using a shape analysis laser microscope (VK-X210, manufactured by Keyence Corporation) with an object lens with a magnification of 50×. The surface having a width of about 280 μm in a specific direction and a width of about 220 μm in a direction perpendicular to the specific direction was used to measure the three-dimensional surface roughness Sa and the three-dimensional surface roughness Sz. The three-dimensional surface roughness Sa and the three-dimensional surface roughness Sz were measured using the direction specified by ISO 25178.

Test pieces that were cut out at three different positions from each of the metal mask substrates of Examples 1 to 3 and Comparison Example 1 were used to measure the surface roughness. Each test piece was a rectangular sheet having a length of 20 mm in the length direction of the metal mask substrate and a length of 30 mm in the width direction of the metal mask substrate.

The two ends in the length direction of the metal mask substrate are referred to as a first end and a second end, and the two ends in the width direction are referred to as a third end and a fourth end. Three test pieces were cut out from each metal mask substrate at the following positions.

That is, Test piece 1 was cut out at the position at a distance of 100 mm from the first end and at a distance of 200 mm from the third end. Test piece 2 was cut out at the position at a distance of 100 mm from the second end and at a distance of 70 mm from the third end. Test piece 3 was cut out at the position at a distance of 100 mm from the second end and at a distance of 70 mm from the fourth end.

The three-dimensional surface roughness Sa and three-dimensional surface roughness Sz were measured at five measurement points in each test piece. The five measurement points include one point in the center of the test piece and four points on a circle surrounding the central point. The four points on the circle in each test piece were located on the diagonal lines of the test piece, and the distance between the central point and the points on the circle was 10 mm.

Table 1 below shows the maximum value of three-dimensional surface roughness Sa and the maximum value of three-dimensional surface roughness Sz of each test piece of the metal mask substrates of Examples 1 to 3.

TABLE 1

|  |  | Sa | Sz |
|---|---|---|---|
| Example 1 | Test piece 1 | 0.09 | 2.83 |
|  | Test piece 2 | 0.08 | 2.63 |
|  | Test piece 3 | 0.09 | 3.17 |
| Example 2 | Test piece 1 | 0.09 | 2.60 |
|  | Test piece 2 | 0.10 | 2.88 |
|  | Test piece 3 | 0.09 | 2.76 |
| Example 3 | Test piece 1 | 0.10 | 2.93 |
|  | Test piece 2 | 0.11 | 2.84 |
|  | Test piece 3 | 0.10 | 2.96 |

As shown in Table 1, Test piece 1 of the metal mask substrate of Example 1 had a maximum three-dimensional surface roughness Sa of 0.09 and a maximum three-dimensional surface roughness Sz of 2.83. Test piece 2 had a maximum three-dimensional surface roughness Sa of 0.08 and a maximum three-dimensional surface roughness Sz of 2.63. Test piece 3 had a maximum three-dimensional surface roughness Sa of 0.09 and a maximum three-dimensional surface roughness Sz of 3.17.

That is, the metal mask substrate of Example 1 had a maximum three-dimensional surface roughness Sa of 0.09 and a maximum three-dimensional surface roughness Sz of 3.17.

Test piece 1 of the metal mask substrate of Example 2 had a maximum three-dimensional surface roughness Sa of 0.09 and a maximum three-dimensional surface roughness Sz of 2.60. Test piece 2 had a maximum three-dimensional surface roughness Sa of 0.10 and a maximum three-dimensional surface roughness Sz of 2.88. Test piece 3 had a maximum three-dimensional surface roughness Sa of 0.09 and a maximum three-dimensional surface roughness Sz of 2.76.

That is, the metal mask substrate of Example 2 had a maximum three-dimensional surface roughness Sa of 0.10 and a maximum three-dimensional surface roughness Sz of 2.88.

Test piece 1 of the metal mask substrate of Example 3 had a maximum three-dimensional surface roughness Sa of 0.10 and a maximum three-dimensional surface roughness Sz of 2.93. Test piece 2 had a maximum three-dimensional surface roughness Sa of 0.11 and a maximum three-dimensional surface roughness Sz of 2.84. Test piece 3 had a maximum three-dimensional surface roughness Sa of 0.10 and a maximum three-dimensional surface roughness Sz of 2.96.

That is, the metal mask substrate of Example 3 had a maximum three-dimensional surface roughness Sa of 0.11 and a maximum three-dimensional surface roughness Sz of 2.96.

Table 2 below shows the maximum value of three-dimensional surface roughness Sa and the maximum value of three-dimensional surface roughness Sz of each test piece of Comparison Example 1.

TABLE 2

|  |  | Sa | Sz |
|---|---|---|---|
| Comparison Example 1 | Test piece 1 | 0.14 | 5.10 |
|  | Test piece 2 | 0.13 | 5.78 |
|  | Test piece 3 | 0.16 | 5.10 |

As shown in Table 2, Test piece 1 of the metal mask substrate of Comparison Example 1 had a maximum three-dimensional surface roughness Sa of 0.14 and a maximum three-dimensional surface roughness Sz of 5.10. Test piece 2 had a maximum three-dimensional surface roughness Sa of 0.13 and a maximum three-dimensional surface roughness Sz of 5.78. Test piece 3 had a maximum three-dimensional surface roughness Sa of 0.16 and a maximum three-dimensional surface roughness Sz of 5.10.

That is, the metal mask substrate of Comparison Example 1 had a maximum three-dimensional surface roughness Sa of 0.16 and a maximum three-dimensional surface roughness Sz of 5.78.

Figure 15:
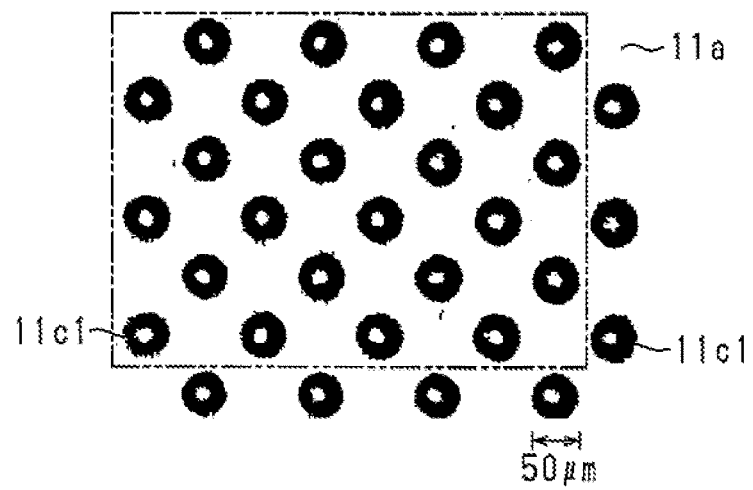
FIG. 15 is an image showing the photographed first surface of Example 1 having first depressions.

FIG. 15 is an image of the reflection light reflected on the first surface in the process of manufacturing a metal mask using the metal mask substrate of Example 1. The image was taken with the first surface illuminated with illumination light after the first depressions were formed in the first surface.

Figure 16:
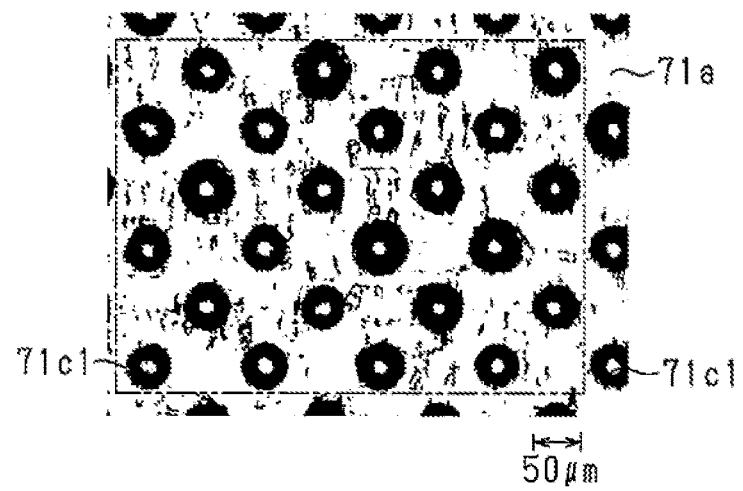
FIG. 16 is an image showing the photographed obverse surface of Comparison Example 1 having first depressions.

FIG. 16 is an image of the reflection light reflected on the first surface in the process of manufacturing a metal mask using the metal mask substrate of Comparison Example 1. The image was taken with the first surface illuminated with illumination light after the first depressions were formed in the first surface.

FIG. 15 shows that the metal mask substrate 11 of Example 1 had an increased adhesion between the metal mask substrate 11 and the first dry film resist 12. As a result, the size of the opening of each first depression 11c1 in the first surface 11a in a plan view of the first surface 11a was substantially equal to the sizes of the openings of the other first depressions 11c1.

In contrast, as shown in FIG. 16, the sizes of the openings of the first depressions 71c1 of the metal mask substrate of Comparison Example 1 varied significantly in a plan view of the obverse surface 71a of the metal layer.

For each of the metal mask substrate of Example 1 and the metal mask substrate of Comparison Example 1, the diameters of twenty-four first depressions were measured. For Example 1, of the first depressions 11c1 shown in FIG. 15, the diameters of the first depressions 11c1 within the region defined by the long dashed double-short dashed line were measured. For comparison Example 1, of the first depressions 71c1 shown in FIG. 16, the diameters of the first depressions 71c1 within the region defined by the long dashed double-short dashed line were measured.

For each first depression, a first diameter, which is the diameter in the vertical direction as viewed in the drawings, and a second diameter, which is the diameter in the horizontal direction as viewed in the drawings, were measured, and a mean diameter, which is the mean value of the first diameter and the second diameter was calculated. Table 3 shows the first diameters, the second diameters, and the mean diameters of Example 1 and Comparison Example 1.

TABLE 3

|  | Example 1 | | | Comparison Example 1 | | |
|---|---|---|---|---|---|---|
| No. | First diameter | Second diameter | Mean diameter | First diameter | Second diameter | Mean diameter |
| 1 | 48.8 | 49.2 | 49.0 | 46.8 | 53.2 | 50.0 |
| 2 | 50.4 | 48.0 | 49.2 | 64.1 | 65.7 | 64.9 |
| 3 | 48.8 | 49.2 | 49.0 | 55.2 | 52.8 | 54.0 |
| 4 | 50.4 | 50.0 | 50.2 | 53.2 | 53.6 | 53.4 |
| 5 | 47.2 | 48.4 | 47.8 | 56.5 | 57.7 | 57.1 |
| 6 | 47.6 | 48.0 | 47.8 | 48.4 | 53.2 | 50.8 |
| 7 | 50.8 | 47.2 | 49.0 | 46.8 | 50.8 | 48.8 |
| 8 | 51.2 | 48.8 | 50.0 | 49.6 | 56.5 | 53.0 |
| 9 | 48.8 | 49.2 | 49.0 | 64.5 | 60.5 | 62.5 |
| 10 | 47.2 | 47.2 | 47.2 | 52.4 | 50.8 | 51.6 |
| 11 | 51.2 | 48.0 | 49.6 | 55.2 | 57.3 | 56.3 |
| 12 | 49.2 | 49.2 | 49.2 | 55.2 | 54.8 | 55.0 |
| 13 | 48.8 | 48.4 | 48.6 | 52.4 | 48.4 | 50.4 |
| 14 | 47.6 | 49.2 | 48.4 | 50.8 | 52.4 | 51.6 |
| 15 | 49.2 | 49.2 | 49.2 | 59.3 | 57.3 | 58.3 |
| 16 | 49.6 | 49.2 | 49.4 | 60.5 | 62.5 | 61.5 |
| 17 | 47.2 | 46.8 | 47.0 | 50.4 | 49.2 | 49.8 |
| 18 | 50.4 | 49.6 | 50.0 | 47.6 | 47.6 | 47.6 |
| 19 | 49.6 | 51.2 | 50.4 | 54.8 | 58.5 | 56.7 |
| 20 | 50.4 | 48.4 | 49.4 | 45.2 | 52.8 | 49.0 |
| 21 | 47.6 | 49.2 | 48.4 | 44.4 | 47.6 | 46.0 |
| 22 | 47.2 | 47.2 | 47.2 | 52.4 | 50.4 | 51.4 |
| 23 | 49.2 | 50.8 | 50.0 | 53.2 | 51.6 | 52.4 |
| 24 | 50.4 | 48.8 | 49.6 | 49.2 | 48.4 | 48.8 |
| Average value | 49.1 | 48.8 | 48.9 | 52.8 | 53.9 | 53.4 |
| Maximum value | 51.2 | 51.2 | 50.4 | 64.5 | 65.7 | 64.9 |
| Minimum value | 47.2 | 46.8 | 47.0 | 44.4 | 47.6 | 46.0 |
| Standard deviation | 1.34 | 1.07 | 0.96 | 5.34 | 4.69 | 4.75 |

As shown in Table 3, the mean diameters of the first depressions 11c1 of Example 1 were between 47.0 μm and 50.4 μm inclusive, and the mean diameters of the first depressions 71c1 of Comparison Example 1 were between 46.0 μm and 64.9 μm inclusive.

For Example 1, values of (B/A)×100(%) were calculated, where A represents the average of the diameters of the openings of the first depressions 11c1 in a plan view of the obverse surface of the metal mask substrate 11, and B represents the value obtained by multiplying the standard deviation of diameters by 3. The values of (B/A)×100(%) were 8.2% for the first diameter, 6.6% for the second diameter, and 5.9% for the mean diameter.

In the same manner as Example 1, values of (B/A)×100 (%) were calculated for Comparison Example 1, where A represents the average of the diameters of the openings of the first depressions 71c1 in a plan view of the obverse surface 71a of the metal layer, and B represents the value obtained by multiplying the standard deviation of diameters by 3. The values of (B/A)×100(%) were 30.3% for the first diameter, 26.1% for the second diameter, and 26.7% for the mean diameter.

With Example 1, the values of (B/A)×100(%) were less than or equal to 8.2%, that is, less than or equal to 10%. This demonstrates that the diameters of the openings of the first depressions 11c1 of the metal mask substrate 11 and thus the diameters of the openings of the through-holes in the metal mask had high dimensional accuracy. In contrast, the values of (B/A)×100(%) of Comparison Example 1 were less than or equal to 30.3%. This demonstrates that Example 1 significantly increased the dimensional accuracy of the diameters of the openings of the first depressions 11c1 of the metal mask substrate 11 and thus the diameters of the openings of the through-holes in the metal mask, as compared with Comparison Example 1.

For each of Example 1 and Comparison Example 1, a histogram showing the frequencies of mean diameters of first depressions with intervals of 2 μm and a histogram showing the frequencies with intervals of 1 μm were made.

Figure 17:
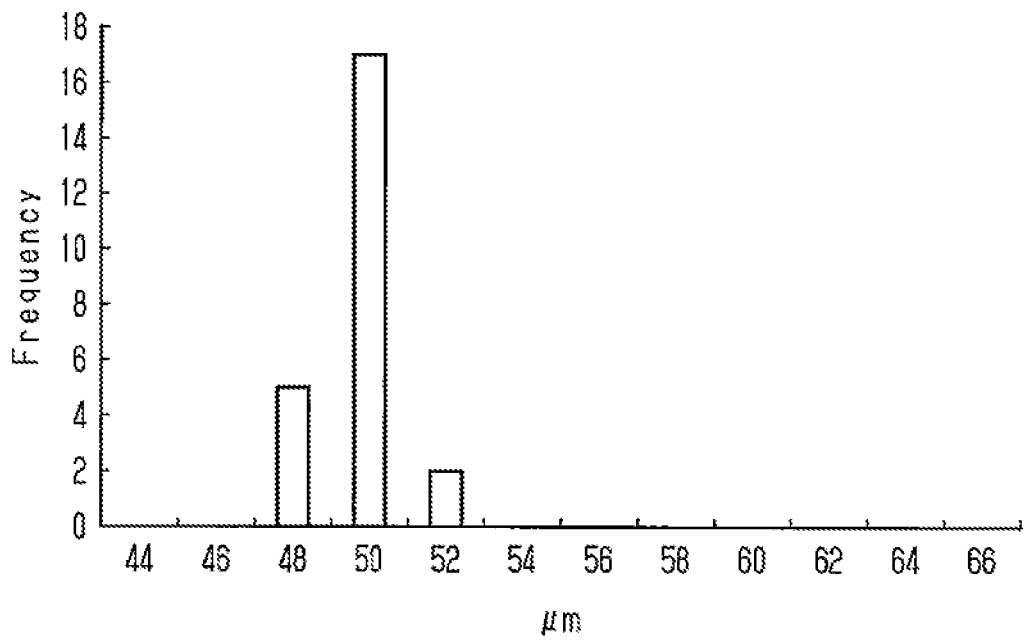
FIG. 17 is a histogram showing the distribution of the diameters of the first depressions in Example 1 with intervals of 2 μm.
Figure 18:
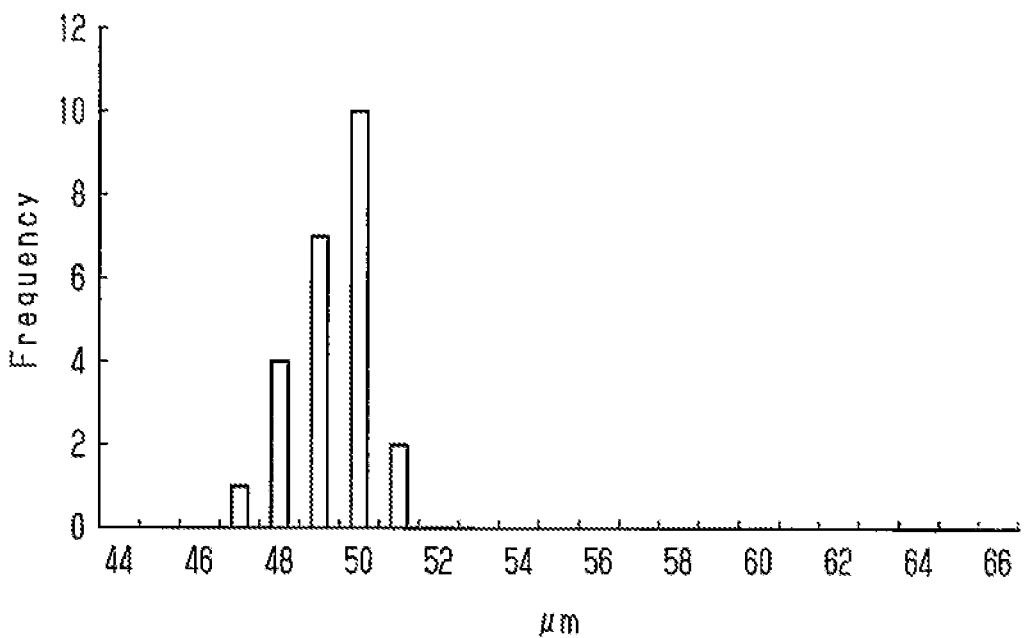
FIG. 18 is a histogram showing the distribution of the diameters of the first depressions in Example 1 with intervals of 1 μm.
Figure 19:
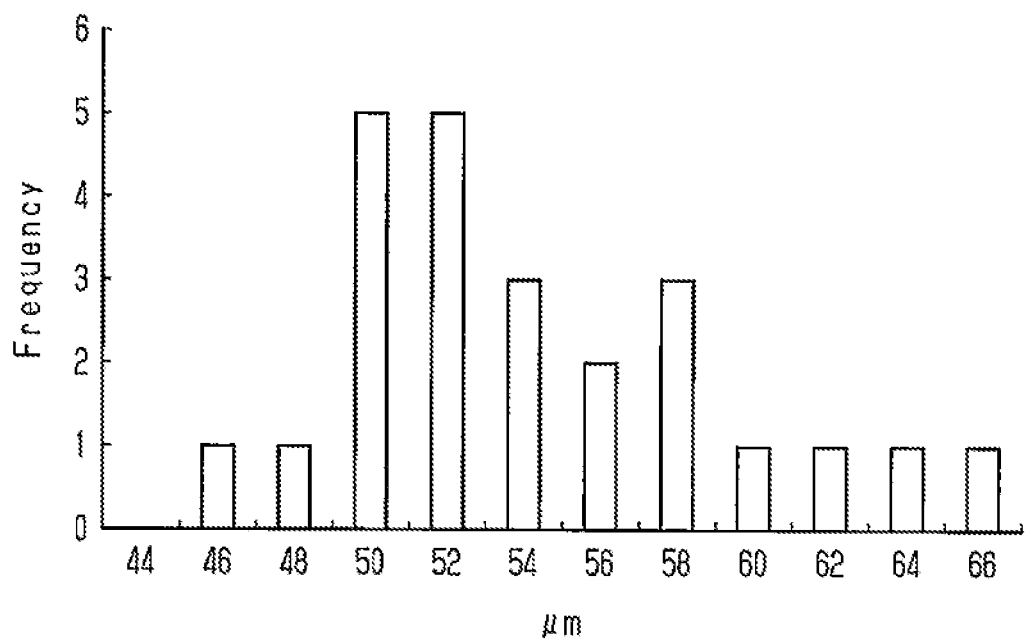
FIG. 19 is a histogram showing the distribution of the diameters of the first depressions in Comparison Example 1 with intervals of 2 μm.
Figure 20:
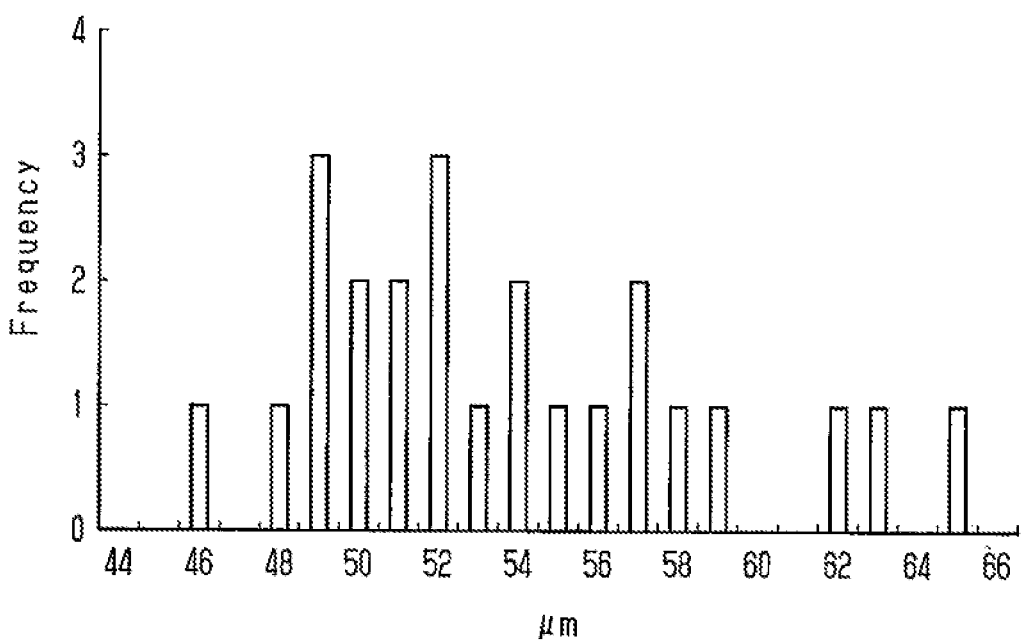
FIG. 20 is a histogram showing the distribution of the diameters of the first depressions in Comparison Example 1 with intervals of 1 μm.

As shown in FIGS. 17 and 18, with Example 1, the frequency of the mean diameters of first depressions was highest for 50 μm. As shown in FIGS. 19 and 20, with Comparison Example 1, the differences between frequencies of the values of the mean diameters were smaller than those in Example 1.

As described above, with the metal mask substrate 11 of Example 1, the increased adhesion between the metal mask substrate 11 and the first dry film resist 12 resulted in the first depressions 11c1 formed with high shape accuracy. In contrast, with the metal mask substrate of Comparison Example 1, the low adhesion between the metal mask substrate and the dry film resist resulted in the first depressions 71c1 formed with low shape accuracy.

Further, Example 2 and Example 3 achieved shapes equivalent to those of the first depressions shown in FIG. 15.

In other words, it is demonstrated that the adhesion between the metal layer 21 and the first dry film resist 12 was increased when the three-dimensional surface roughness Sa was less than or equal to 0.11 μm and the three-dimensional surface roughness Sz was less than or equal to 3.17 μm in one surface of the metal mask substrate 11.

As for the formation of the second depressions 11c2 in the second surface 11b of the metal mask substrate 11, the structure having the surface roughness described above demonstrated the tendency of achieving increased adhesion between the metal mask substrate 11 and the second dry film resist 13, in the same manner as the first depressions 11c1 of the first surface 11a of the metal mask substrate 11.

The embodiments of a metal mask substrate for dry film resist, a metal mask, and a method for manufacturing a metal mask described above have the following advantages.

(1) The three-dimensional surface roughness Sa is less than or equal to 0.11 μm, and the three-dimensional surface roughness Sz is less than or equal to 3.17 μm. This limits the formation of gaps between the first surface 11a and the first dry film resist 12, increasing the adhesion at the interface between the first dry film resist 12 and the obverse surface of the metal layer 21.

(2) The second surface 11b has a three-dimensional surface roughness Sa of less than or equal to 0.11 μm and a three-dimensional surface roughness Sz of less than or equal to 3.17 μm. This increases the adhesion between the second dry film resist 13 and the metal layer 21 also at the second surface 11b of the metal layer 21, increasing the accuracy of etching of the first surface 11a and the second surface 11b.

(3) When the obverse surface of the metal mask substrate 11 is made of Invar, whose linear expansion coefficient is equivalent to that of a glass base, the metal mask that is formed of the metal mask substrate, that is, the metal mask manufactured with high shape accuracy, may be used for the deposition on a glass base.

(4) When the metal mask substrate includes the plastic layer 22 made of polyimide, whose linear expansion coefficient is equivalent to that of Invar, the metal mask 30 resists warpage, which would otherwise occur when the temperature of the metal mask 30 changes, even though the metal mask substrate 11 includes two different materials. This allows the metal mask 30 to have high shape accuracy and enhanced mechanical strength.

(5) In addition to the first surface 11a, the second surface 11b also has increased adhesion between the second dry film resist 13 and the metal layer 21. This increases the shape accuracy of the through-holes 11c when the through-holes 11c are formed by etching the first surface 11a and the second surface 11b.

The above-described embodiments may be modified as follows.

The cross-sectional area of each through-hole 11c may be substantially uniform over the entire length in the thickness direction of the metal layer 21. Alternatively, the cross-sectional area of each through-hole 11c may increase from the first surface 11a toward the second surface 11b in the thickness direction of the metal layer 21, or may decrease from the first surface 11a toward the second surface 11b.

Instead of Invar, the metal layer 21 may be made of any pure metal or alloy. When the metal layer 21 is made of a material other than Invar, the plastic layer in contact with the metal layer 21 may be made of a plastic whose linear expansion coefficient is such that the difference between the linear expansion coefficient of the plastic and the linear expansion coefficient of the material forming the metal layer 21 is smaller than the difference between the linear expansion coefficient of the material forming the metal layer 21 and the linear expansion coefficient of polyimide.

The second surface 11b of the metal layer 21 may have a three-dimensional surface roughness Sa of greater than 0.11 μm and a three-dimensional surface roughness Sz of greater than 3.17 μm. Such a structure still allows the adhesion between the metal layer 21 and the first dry film resist 12 to be increased at least at the first surface 11a.

The metal mask 30 is not limited to the metal mask used for depositing the material of organic electroluminescent devices onto a glass base by vaporization. The metal mask 30 may be used for other purposes, such as for depositing various metal materials through vapor deposition or sputtering. In this case, the through-holes 11c may be arranged irregularly in a plan view of the first surface 11a.

The resist used to etch the metal mask substrate is not limited to the dry film resist described above and may be a resist formed by applying a liquid for forming a resist to the metal mask substrate. That is, the resist may be placed on the obverse surface of the metal mask substrate through coating or affixing. Even when such a resist has low adhesion to the obverse surface of the metal mask substrate, the metal mask substrate described above achieves the same advantage as when a dry film resist is used.

DESCRIPTION OF THE REFERENCE NUMERALS

10 . . . Metal Mask Formation Intermediate, 11 . . . Metal mask substrate, 11a . . . First Surface, 11aM . . . First Mask Surface, 11b . . . Second Surface, 11bM . . . Second Mask Surface, 11c . . . through-Hole, 11c1 and 71c1 . . . First Depression, 11c2 . . . Second Depression, 11M . . . Mask Substrate, 12 . . . First Dry Film Resist, 12a . . . First through-Hole, 13 and 14 . . . Second Dry Film Resist, 13a . . . Second through-Hole, 21 and 23 . . . Metal Layer, 21a . . . Base Material, 21b . . . Rolled Material, 22 . . . Plastic Layer, 30 . . . Metal Mask, 41 . . . First Opening, 42 . . . Second Opening, 43 . . . Constricted Part, 50 . . . Rolling Mill, 51 and 52 . . . Roll, 53 . . . Annealing device, 61 . . . Second Protection Layer, 62 . . . First Protection Layer, 71a . . . Obverse Surface, C . . . Core

The invention claimed is:

1. A metal mask substrate comprising:
a metal obverse surface, the metal obverse surface being a first surface;
a first resist on the obverse surface;
a metal second surface, which is a surface opposite to the first surface; and
a second resist on the second surface, wherein
the obverse surface has a three-dimensional surface roughness Sa of less than or equal to 0.11 μm,
the obverse surface has a three-dimensional surface roughness Sz of less than or equal to 3.17 μm,
the second surface has a three-dimensional surface roughness Sa of less than or equal to 0.11 μm, and
the second surface has a three-dimensional surface roughness Sz of less than or equal to 3.17 μm.

2. The metal mask substrate according to claim 1, wherein the obverse surface is made of Invar.

3. The metal mask substrate according to claim 1, further comprising a metal layer, which is made of Invar, wherein
the obverse surface is an obverse surface of the metal layer, and
the metal mask substrate further comprises a polyimide layer, which faces a surface of the metal layer that is opposite to the obverse surface.

4. The metal mask substrate according to claim 1, wherein
the first resist is a dry film resist, and
the obverse surface is configured such that the dry film resist is affixed to the obverse surface.

* * * * *